(12) United States Patent
Leong et al.

(10) Patent No.: US 8,878,612 B2
(45) Date of Patent: Nov. 4, 2014

(54) ACCURATE BIAS TRACKING FOR PROCESS VARIATION AND SUPPLY MODULATION

(71) Applicant: Marvell World Trade Ltd., St. Michael (BB)

(72) Inventors: Poh Boon Leong, Singapore (SG); Nuntha Kumar Krishnasamy Maniam, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/944,608

(22) Filed: Jul. 17, 2013

(65) Prior Publication Data

US 2013/0300506 A1    Nov. 14, 2013

Related U.S. Application Data

(63) Continuation of application No. 13/332,190, filed on Dec. 20, 2011, now Pat. No. 8,514,023.

(60) Provisional application No. 61/426,740, filed on Dec. 23, 2010.

(51) Int. Cl.
| H03F 3/04 | (2006.01) |
|---|---|
| H03F 3/24 | (2006.01) |
| H03F 3/193 | (2006.01) |
| H03F 3/16 | (2006.01) |
| G05F 3/26 | (2006.01) |
| H03F 3/45 | (2006.01) |

(52) U.S. Cl.
CPC .............. *H03F 3/16* (2013.01); *H03F 3/245* (2013.01); *H03F 3/193* (2013.01); *H03F 2203/45311* (2013.01); *H03F 2203/45544* (2013.01); *H03F 2203/45554* (2013.01); *G05F 3/262* (2013.01); *H03F 2200/555* (2013.01); *H03F 2203/45294* (2013.01); *H03F 2203/45304* (2013.01); *H03F 3/45179* (2013.01); *H03F 2203/45301* (2013.01); *H03F 2203/45352* (2013.01)
USPC .......................................... 330/288; 323/315

(58) Field of Classification Search
USPC ......................................... 330/288, 285, 296
See application file for complete search history.

(56) References Cited

U.S. PATENT DOCUMENTS

| 6,064,267 A | 5/2000 | Lewyn | |
|---|---|---|---|
| 6,714,081 B1 * | 3/2004 | Xu | ................................ 330/296 |

(Continued)

OTHER PUBLICATIONS

International Search Report and Written Opinion of International Searching Authority, International Application No. PCT/IP2011/003331, Mar. 5, 2013.

*Primary Examiner* — Henry Choe

(57) ABSTRACT

A current mirror includes a bias branch, which includes first and second transistors in series between a voltage source and ground, a voltage divider coupled between the voltage source and ground, an op-amp configured to receive a divided voltage of the voltage divider and a voltage of a node between the first and second transistors, and drive a gate of the second transistor to pull the node to the divided voltage. The current mirror further includes a power amplifier core coupled to the bias branch. The power amplifier core includes first and second drive transistors configured in series between the voltage source and ground. Gates of the first transistor and the first drive transistor are coupled, and gates of the second transistor and the second drive transistor are coupled.

18 Claims, 4 Drawing Sheets

(56) References Cited

U.S. PATENT DOCUMENTS

| | | |
|---|---|---|
| 7,304,539 B2 | 12/2007 | Tsurumaki et al. |
| 8,093,952 B2 * | 1/2012 | Behzad et al. ............... 330/288 |
| 8,203,383 B2 * | 6/2012 | Oswal et al. ............... 330/253 |
| 2008/0258779 A1 | 10/2008 | Wadatsumi et al. |
| 2009/0315621 A1 | 12/2009 | Narathong et al. |
| 2010/0316172 A1 | 12/2010 | Keehr et al. |

* cited by examiner

ACCURATE BIAS TRACKING FOR PROCESS VARIATION AND SUPPLY MODULATION

CROSS REFERENCE TO RELATED APPLICATIONS

This application is a continuation of U.S. patent application Ser. No. 13/332,190 filed Dec. 20, 2011, now U.S. Pat. No. 8,514,023, which claims priority benefit under 35 U.S.C. §119(e) of U.S. Provisional Application No. 61/426,740, filed Dec. 23, 2010, each of which is hereby incorporated by reference herein in its entirety.

FIELD OF USE

Embodiments of the present invention generally relate to current mirror circuits, and more particularly embodiments of the present invention relate to accurate bias tracking for process variation and supply modulation in current mirror circuits.

BACKGROUND

Unless otherwise indicated herein, the approaches described in this section are not prior art to the claims in this application and are not admitted to be prior art by inclusion in this section.

A current mirror is a circuit configured to copy a current in one branch of the circuit by controlling the current in another branch of the circuit so that the output current of the circuit may be held constant regardless of whether the load on the circuit changes. The current being copied may be for a DC source or an AC source. Current mirrors find use in a variety of applications, such as power amplification. A amplifier might be configured to receive an RF signal and amplify the power of the RF signal. To accurately reproduce the RF signal with amplified power, the power amplifier may be biased by a current mirror so that the current of the power amplifier remains constant.

FIG. 1 is a simplified schematic of a known current mirror 100. The current mirror includes a bias branch 105 and a power amplifier (PA) core 110. The bias branch 105 includes transistors M1 and M3 in series and the PA core includes transistors M2 and M4 in series. The transistors of the current mirror are MOSFETs. For convenience, transistors M1, M2, M3, and M4 are sometimes referred to herein as M1, M2, M3, and M4, respectively, without the prefix term "transistor." M1 and M2 are source connected to a power source Vdd with M1 connected to Vdd via a controlled current source 112 and with M2 source connected to Vdd via an inductor 115. The source and gate of M1 are connected to define a gate-source node, which is connected to the gate of M2 to bias M2. A first Vout1 node is disposed between inductor 115 and the source of M2.

M3 and M4 are drain connected to ground with M4 drain connected to ground via an inductor 120. The drain and gate of M3 are connected to define a gate-drain node, which is connected to the gate of M4 to bias M4. A second Vout2 node is disposed between inductor 120 and the drain of M4. M1 and M3 act as a voltage divider for Vdd where the node X between M1 and M3 should be Vdd/2. Similarly M2 and M4 act as a voltage divider where the voltage at node Y should also be Vdd/2. Node Y is the input node for an AC input into the PA core.

For accurate current mapping by current mirror 100, the voltage of node X between M1 and M3 should track the voltage of node Y between M2 and M4. However, the voltage of node X can be indeterminate. The indeterminate nature of the voltage at node X makes node Y to be either more or less than Vdd/2, which effects the current mirroring and thereby effects the linearity range of the PA core.

SUMMARY

Embodiments of the present invention generally relate to current mirror circuits, and more particularly embodiments of the present invention relate to accurate bias tracking for process variation and supply modulation in current mirror circuits.

According to one embodiment of the present invention, a current mirror includes a bias branch coupled to a power amplifier core. The bias branch includes first and second transistors configured in series between a voltage source and a ground, and a voltage divider coupled between the voltage source and the ground. The bias branch further includes an op-amp configured to receive as input a divided voltage of the voltage divider and a voltage of a node between the first and second transistors. The op-amp is configured to drive a gate of the second transistor to pull the node to the divided voltage if the voltage at the node raises above the divided voltage or drops below the divided voltage. The power amplifier core includes third and fourth transistors configured in series between the voltage source and the ground. A gate of the first transistor and a gate of the third transistor are coupled. The gate of the second transistor and a gate of the fourth transistor are coupled.

According to a specific embodiment, the first and second transistors are complimentary to the third and fourth transistors.

According to another specific embodiment, the divided voltage is a voltage of the voltage source divided by two.

According to another specific embodiment, the voltage divider includes first, second, and third resistors in series with the first resistor coupled to the voltage source, the third resistor coupled to ground, and the second resistors coupled between the first and the third resistors. First and second source-drain regions of the first transistor are coupled, respectively, to the voltage source and the first source-drain region of the second transistor. A second source-drain region of the second transistor is coupled to ground. The bias branch further includes a second op-amp having a first input coupled to the first source-drain region of the first transistor, a second input coupled to the voltage divider between the first resistor and the second resistor and configured to receive a second divided voltage of the voltage source. The second op-amp further includes output configured to drive a gate of the first transistor to pull the second node to the second divided voltage if a second voltage at the second node raises above the second divided voltage or drops below the second divided voltage.

According to another specific embodiment, the bias branch further includes a coupling capacitor disposed between the first source-drain region and the gate of the first transistor.

According to another specific embodiment, the current mirror of further includes a first bias resistor coupled between the gate of the first transistor and the gate of the third transistor, and a second bias resistor coupled between the gate of the second transistor and the gate of the fourth transistor.

According to another specific embodiment, the current mirror further includes first and second capacitors coupled to opposite ends of the first bias resistors; and third and fourth capacitors coupled to opposite ends of the second bias resistor.

According to another specific embodiment, the first, second, third, and fourth capacitors are configured to decouple an input node of the current mirror from an output node of the current mirror.

According to another specific embodiment, a node between the third and fourth transistors is an input node configured to receive an AC signal. A node between the first inductor and the third transistor is a first output node. A node between the second inductor and the fourth transistor is a second output node.

According to another specific embodiment, the bias branch further includes a controlled-current source coupled between the voltage source and a first source-drain region of the first transistor, and the power core is configured to mirror a current from the controlled-current source provided to the bias branch.

According to another specific embodiment, the bias branch further includes a fifth transistor coupled between the controlled-current source and the first source-drain region of the first transistor, and a sixth transistor coupled between the ground and a first source-drain region of the second transistor. The PA core further includes a seventh transistor coupled between the first inductor and a first source-drain region of the third transistor, and an eighth transistor coupled between the ground and a first source-drain region of the fourth transistor. The gates of the fifth and the seventh transistors are coupled to a first bias-voltage source, and the gates of the sixth and eighth transistors are coupled to each other and to a second bias-voltage source.

According to another specific embodiment, the fifth, sixth, seventh, and eighth transistors are configured to decouple an input of the cascade mirror from outputs of the cascade mirror.

According to another specific embodiment, the current mirror further includes a first resistor coupled between the gate of the fifth transistor and the gate of the seventh transistor, and a second resistor coupled between the gate of the second transistor and the gate of the fourth transistor.

According to another specific embodiment, the current mirror further includes first and second capacitors coupled to opposite ends of the first resistor; and third and fourth capacitors coupled to opposite ends of the second resistor.

According to another embodiment, a circuit method for controlling node voltages of a current mirror includes comparing a reference voltage with first node voltage at a node between first and second transistors, which form a bias branch of a current mirror, and generating a voltage signal that represents a difference between the reference voltage and the first node voltage. The circuit method further includes applying the voltage signal to a gate of the first transistor to drive the first node voltage to a determinate voltage.

According to a specific embodiment, the determinate voltage is the reference voltage.

According to another specific embodiment, the method further includes voltage dividing down a supply voltage via a set of resistors to generate the reference voltage.

According to another specific embodiment, the method further includes comparing a second reference voltage with second node voltage at a node between the second transistor and a voltage source, and generating a second voltage signal that represents a difference between the second reference voltage and the second node voltage. The method further includes applying the second voltage signal to a gate of the second transistor to drive the second node voltage to a second determinate voltage.

According to another specific embodiment, the second determinate voltage is the second reference voltage.

According to another specific embodiment, the method further includes voltage dividing down the supply voltage via the set of resistors to generate the second reference voltage, wherein the first reference voltage is lower than the second reference voltage.

The following detailed description and accompanying drawings provide a more detailed understanding of the nature and advantages of the present invention.

DETAILED DESCRIPTION

Described herein are circuit embodiments for current mirrors and circuit operation methods for the current mirrors where the current mirrors provide substantially accurate bias tracking for process variation and supply modulation. Via accurate bias tracking, the current mirroring and hence the linearity range of the current mirrors are improved. Thereby, a signal received by a current mirror according to embodiments of the present invention may be power amplified relatively accurately and predictably.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
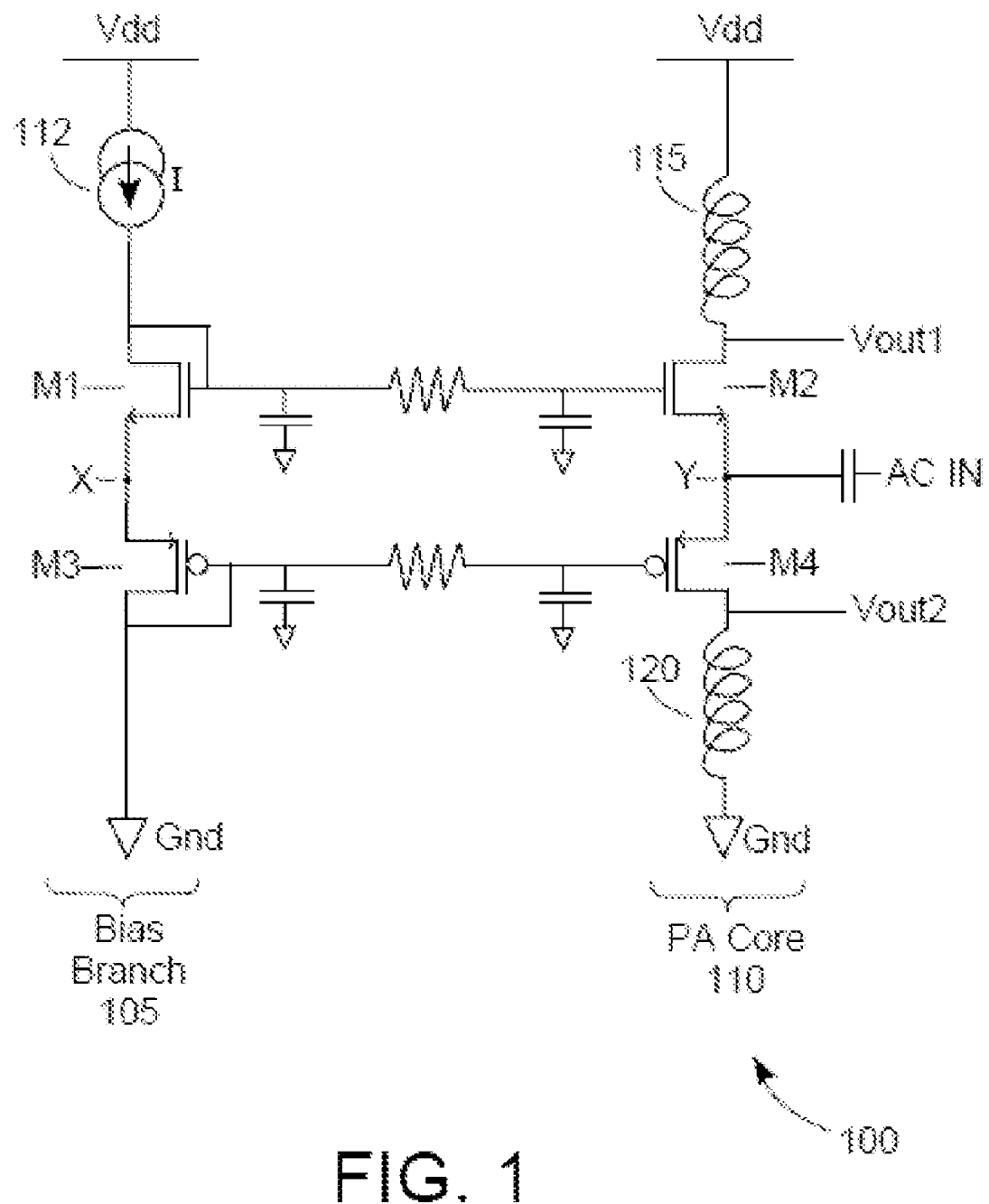
FIG. 1 is a simplified schematic of a known current mirror.
Figure 2:
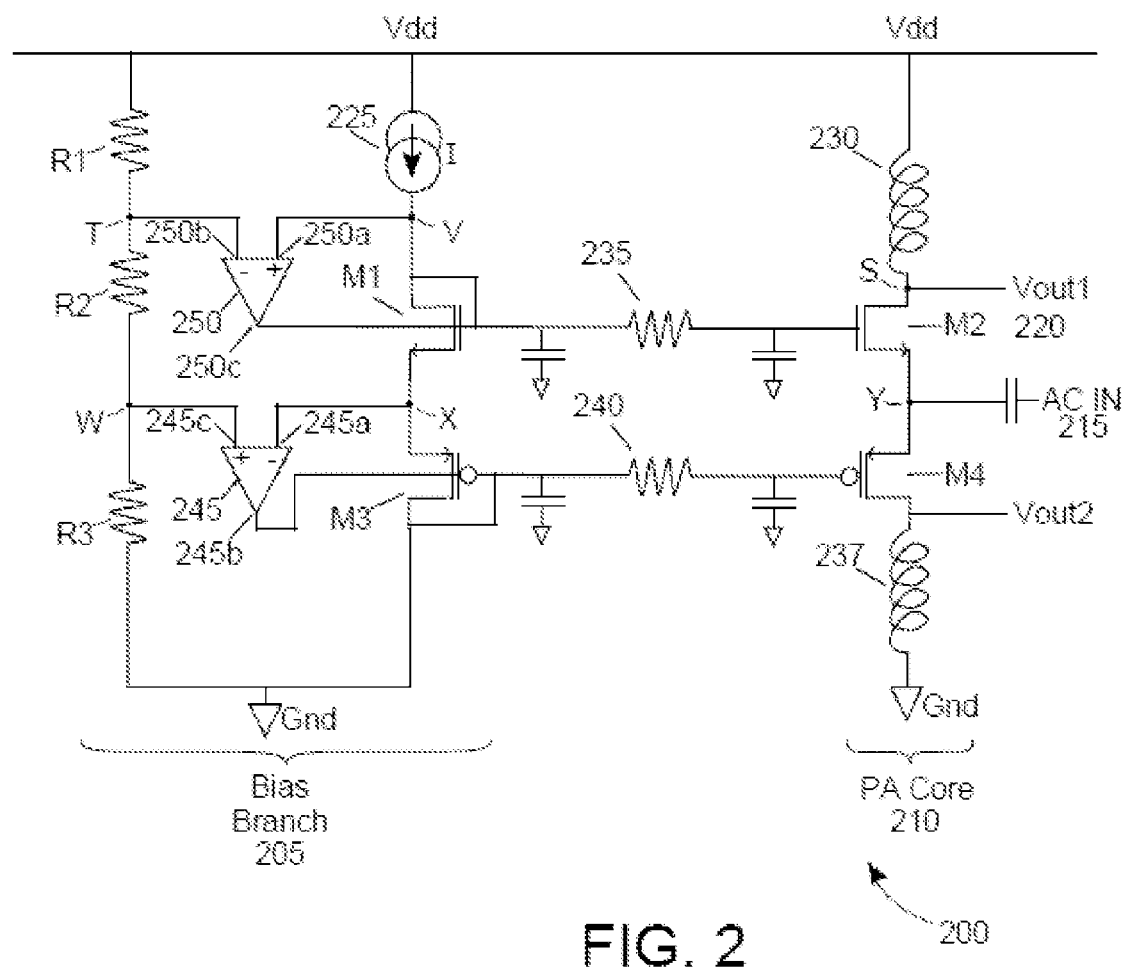
FIG. 2 is a simplified schematic of a current mirror according to one embodiment of the present invention.

Current mirrors are circuits that are configured to copy a current in one branch of the circuit by controlling the current in another branch of the circuit so that the output current of the circuit may be held content regardless of whether the load on the circuit changes. FIG. 2 is a simplified schematic of a current mirror 200 according to one embodiment of the present invention. The current mirror includes a bias branch 205 and a power amplifier (PA) core 210. Current mirror 200 may be configured to amplify the power of a received signal 215, such as a radio frequency (RF) signal, and output a power-amplified signal 220.

According to one embodiment, bias branch 205 includes bias transistors M1 and M3 connected in series and the PA core includes drive transistors M2 and M4 connected in series. M1, M2, M3, and M4 may be MOSFETs. M1 and M2 may be complimentary to M3 and M4. Specifically, M1 and M2 may be pMOS transistors and M3 and M4 may be nMOS transistors. M1 and M2 may be connected via the sources of M1 and M2 to a power source Vdd with the source of M1 connected to Vdd via a controlled current source 225, and with the source of M2 connected to Vdd via an inductor 230. The gates of M1 and M2 may be coupled with M1 configured to bias M2. The gates may be coupled by a bias resistor 235. It will be understood by those of skill in the art that while in one specific configuration of sources and drains is described, the sources and drains of the various transistors may be otherwise arranged according to alternative embodiments of the present invention. Further, other transistor technology may be used in the alternative embodiments. The described alternative embodiments and the equivalents of the described alternative embodiments are to be considered embodiments of the presently described invention. It is noted that specific source and drain configurations of the transistors are described as a matter of convenience to provide a full understanding of specific embodiments.

According to one embodiment, the source of M3 is coupled to the drain of M1, and the source of M4 is coupled to the drain of M2. The drains of M3 and M4 may be connected to ground. The drain of M4 may be coupled to ground via an inductor 237. The gates of M3 and M4 may be coupled with M3 configured to bias M4. The gates of M3 and M4 may be coupled via a bias resistor 240. A first Vout1 node is disposed between inductor 230 and the source of M2, and a second Vout2 node is disposed between inductor 237 and the drain of M4.

According to one embodiment, a first op-amp 245 is coupled to a node X where node X is between the drain of M1 and the source of M3. The op-amp is configured to control the voltage of node X so that the voltage at node X is not indeterminate. Providing that the voltage at node X is not indeterminate further provides that the voltage at node X tracks the voltage at a node Y, which is between the drain of M2 and the source of M4. Node Y is the input of current mirror 200 and may be configured to receive an AC signal so that the PA core may amplify the received AC signal.

First op-amp 245 is further configured to control the source-gate voltages of M3 and M4 so that the source-gate voltages track. According to a specific embodiment, node X is coupled to a negative input 245a of the first op-amp and an output 245b of the first op-amp is coupled to the gates of M3 and M4. A node W is coupled to a positive input 245c where node W is set at a reference voltage. The reference voltage at node W is set by series resistors R1, R2, and R3, which are disposed in series from Vdd to ground. Resistor R1 may be coupled directly to Vdd and resistor R3 may be coupled directly to ground with resistor R2 coupled between resistors R1 and R3. Resistors R1, R2, and R3 are configured as voltage dividers to set node W and a node T to predetermined reference voltages. According to one embodiment, the reference voltage at node W is set by resistors R1, R2, and R3 and is the reference voltage for the first op-amp. Resistors R1, R2, and R3 may be selected so that the reference voltage at node W is Vdd/2. Node X will be driven to Vdd/2 by the first op-amp, which is configured to drive the gate of M3 higher or lower so that M3 may drive node X to the reference voltage at node W (e.g., Vdd/2) if the voltage at node X drifts above or below the reference voltage at node W. By driving node X to the reference voltage at node W, the voltage at node X will not be indeterminate and the source-gate voltages of M3 and M4 will also be made to track. Driving node X to the known reference voltage at node W results in node Y also being set to the reference voltage at node W (e.g., Vdd/2), which extends the linearity range of the PA core across the process variation and temperature (PVT) parameters.

According to another embodiment of the present invention, a second op-amp 250 is coupled to a node V, the node T, and the gates of M1 and M2. A positive input 250a of the second op-amp is coupled to node V where node V is disposed between controlled current source 225 and the source of M1. A negative input 250b of the second op-amp is coupled to node T, and an output 250c of the second op-amp is coupled to the gates of M1 and M2.

The voltage of node T is set by resistors R1, R2, and R3, which are serially coupled between Vdd and ground. R1, R2, and R3 operate as a voltage divider to set the voltage of node T. The voltage at node T is the reference voltage for the second op-amp.

Node V will be driven to the predetermined reference voltage at node T by the second op-amp, which is configured to drive the gate of M1 higher or lower so that M1 may drive node V to the predetermined reference voltage if the voltage at node V drifts above or below the reference voltage at node T. By driving node V to the reference voltage at node T, the voltage at node V will not be indeterminate and the source-gate voltages of M1 and M2 will be made to track. Also, by driving node V to the voltage at node T, the predetermined voltage at node V will be substantially close to the voltage at node S where node S is between inductor 230 and the source of M2. For example, the predetermined voltage at node V may be within approximately 3 percent of the voltage at node S where the voltage at node S is Vdd. The voltage at node V is set to a substantial maximum voltage via controlled-current source 225 being in the saturation region across the PVT parameters. With the voltage of node V substantially close to the voltage at node S, the current from controlled-current source 225 will be substantially accurately mirrored in the PA core.

With the voltages at node V and node X set at predetermined reference voltages, not only are the nodal voltages controlled, but the source-drain voltage drop across M1 and M3 are deterministic. Similarly, with the voltages at node S and node Y set to track the voltages at node V and node X respectively, the source-drain voltages across M2 and M4 are deterministic. Controlling the voltages at the various nodes V, S, X, and Y, and the voltage drops across the M1, M2, M3, and M4 provides that the current tracking of current mirror is substantially improved and the linearity range of the PA core is substantially improved across the PVT parameters.

According to one embodiment, the resistances of the resistors R1, R2, and R3 are substantially fixed values. It is noted that if Vdd shifts up or down, the voltages at node V and node X will track the rise and fall of Vdd. For example, the voltage of node X will remain substantially at Vdd/2 regardless of whether Vdd at the source shifts up or down.

Figure 3:
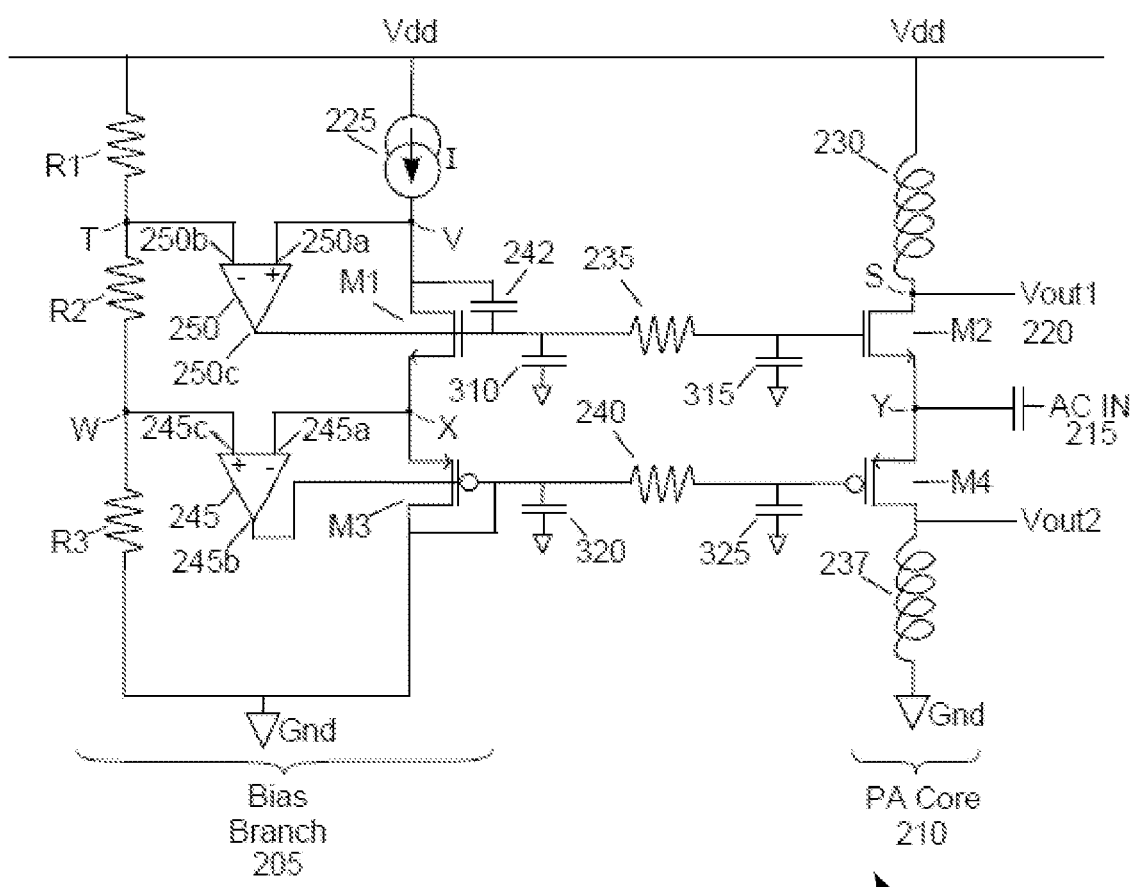
FIG. 3 is a simplified schematic of a current mirror according to an alternative embodiment of the present invention.

FIG. 3 is a simplified schematic of a current mirror 300 according to an alternative embodiment of the present invention. The same numbering scheme used above with respect to current mirror 200 is used for identifying substantially similar elements of current mirror 300. Current mirror 300 is substantially similar to current mirror 200 but differs in that current mirror 300 includes a coupling capacitor 305 disposed across the source and the gate of M1. Current mirror 300 may further include capacitors 310 and 315 disposed on opposite sides of bias resistor 235. A first capacitor node of capacitor 310 is coupled to a first side of bias resistor 235 and to the gate of M1. A second capacitor node of capacitor 310 is coupled to ground. A first capacitor node of capacitor 315 is coupled to a second side of bias resistor 235 and to the gate of M2. A second capacitor node of capacitor 315 is coupled to ground. The source and gate of M1 may also be coupled by a coupling capacitor 440.

Current mirror 300 may further include capacitors 320 and 325 disposed on opposite sides of bias resistor 242. A first capacitor node of capacitor 320 is coupled to a first side of bias resistor 240 and to the gate of M3. A second capacitor node of capacitor 320 is coupled to ground. A first capacitor node of capacitor 325 is coupled to a second side of bias resistor 240 and to the gate of M4. A second capacitor node of capacitor 325 is coupled to ground. Capacitors 310, 315, 320, and 325 are configured to isolate an AC signal received at the input at node Y from coupling to the bias branch.

Figure 4:
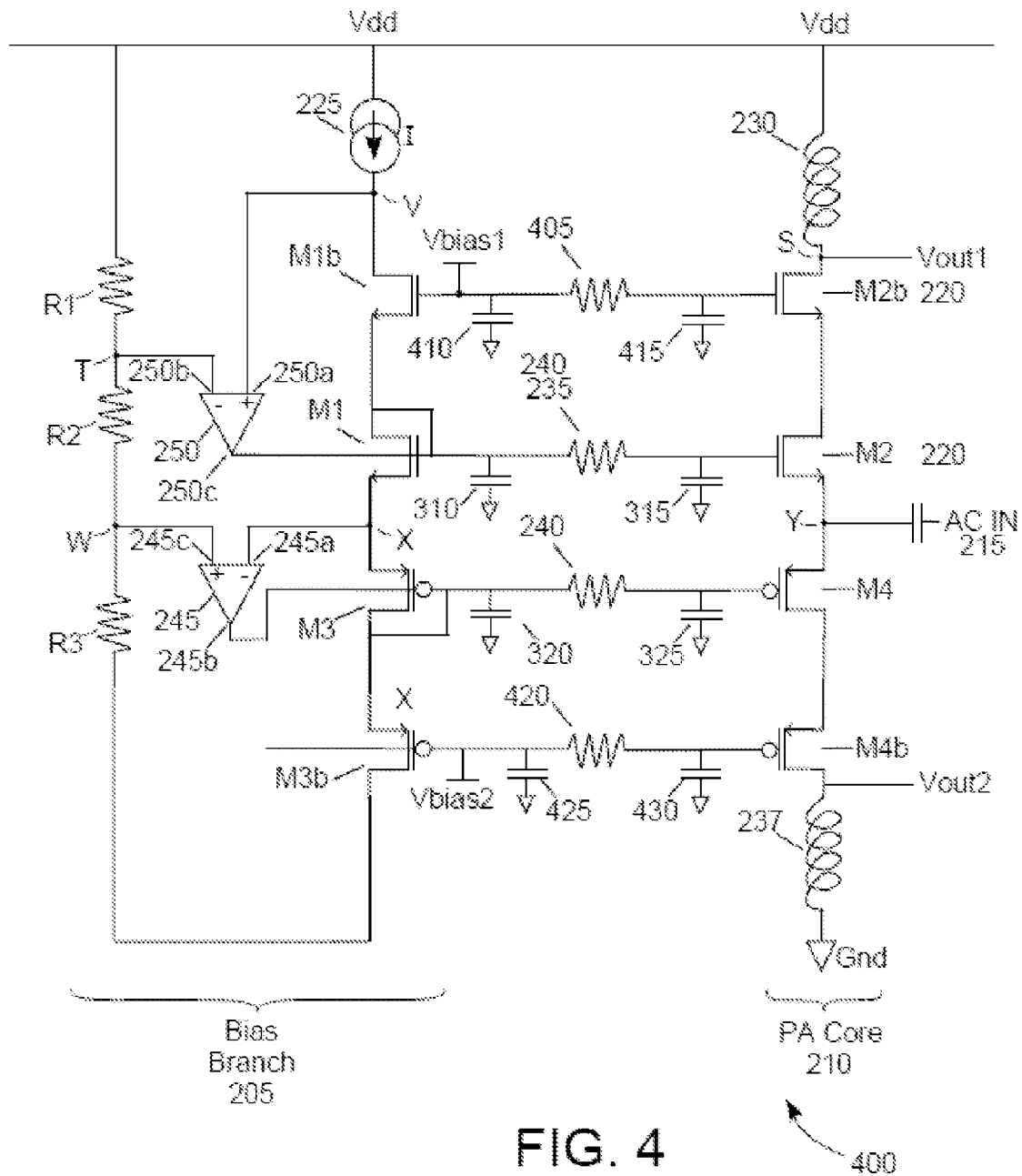
FIG. 4 is a simplified schematic of a current mirror according to another alternative embodiment of the present invention.

FIG. 4 is a simplified schematic of a current mirror 400 according to another alternative embodiment of the present invention. Current mirror 400 is substantially similar to current mirror 200 and current mirror 300 but differs in that current mirror 400 includes cascade transistors M1*b* and M2*b* coupled between the bias branch and the PA core. Current mirror 400 also includes cascade transistors M3*b* and M4*b* coupled between the bias branch and the PA core. M1*b* and M2*b* may be pMOS transistors, and M3*b* and M4*b* may be nMOS transistors. M1*b* may be disposed in series with M1 and may have a source coupled to controlled-current source 225 and a drain coupled to the source of M1. M2*b* may be disposed in series with M2 and may have a source coupled to inductor 230 and a drain coupled to the source of M2. The gates of M1*b* and M2*b* may be coupled via a biasing resistor 405. Capacitors 410 and 415 may be coupled to the gates of M1*b* and M2*b*, and to biasing resistor 405 substantially similarly to the coupling of capacitors 310 and 315 to M1, M2, and biasing resistor 235 as described above with respect to current mirror 300. As described above with respect to current mirror 100, specific configurations of drains and sources of the various transistors are described for convenience. It will be understood by those of skill in the art that specific source and drain configurations may be alternatively arranged according to alternative embodiments of the present invention based, for example, on other transistor technology used.

M3*b* may be disposed in series with M3 and may have a drain coupled to ground and a source coupled to the drain of M3. M4*b* may be disposed in series with M4 and may have a drain coupled to ground via inductor 235 and a source coupled to the drain of M4. The gates of M3*b* and M4*b* may be coupled via a biasing resistor 420. Capacitors 425 and 430 may be coupled to the gates of M3*b* and M4*b*, and to biasing resistor 420 substantially similarly to the coupling of capacitors 320 and 325 to M3, M4, and biasing resistor 240 as described above with respect to current mirror 300. The first output Vout1 of current mirror 400 is between the source of M2*b* and inductor 230, and the second output Vout2 of current mirror 400 is between the drain of M4*b* and inductor 235. The gate of M1*b* may be coupled to a first bias-voltage source configured to provide a first bias voltage Vbias1 to the gate of M1*b*, and the gate of M3*b* may be coupled to a second bias-voltage source configured to provide a second bias voltage Vbias2 to the gate of M3*b*. Vbias1 and Vbias2 provide that transistors M1*b*, M2*b*, M3*b*, and M4*b* turn on relatively strongly.

According to one embodiment, M1*b* and M2*b* arranged in the described cascade configuration are configured to isolate an AC signal received at the input (node Y) from the first output Vout1. M3*b* and M4*b* arranged in the described cascade configuration are configured to isolate an AC signal received at the input (node Y) from the second output Vout2. The cascade pair of M1*b* and M2*b* further force the source voltage of M1 and M2 to track, and the cascade pair of M3*b* and M4*b* further force the drain voltages of M3 and M4 to track by further controlling the voltages at nodes X and V. Improved tracking of voltages between the bias branch and the PA core provides further improved tracking of the current from the controlled-current to in the PA core and further improvement of the linearity range of the PA core across the PVT parameters.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. A circuit method for controlling node voltages of a current mirror comprising:

receiving, by an op-amp of a bias branch, a divided voltage of a voltage divider and a voltage of a node between first and second transistors, wherein the first and second transistors are configured in series between a voltage source and a ground, and wherein the voltage divider is coupled between the voltage source and the ground; and driving, by the op-amp, a gate of the second transistor to pull the node to the divided voltage, wherein a power amplifier core is coupled to the bias branch, the power amplifier core including third and fourth transistors configured in series between the voltage source and the ground, wherein a gate of the first transistor and a gate of the third transistor are coupled, and the gate of the second transistor and a gate of the fourth transistor are coupled.

2. The circuit method of claim 1, wherein the first and third transistors are complementary to the second and fourth transistors.

3. The circuit method of claim 1, wherein the divided voltage is a voltage of the voltage source divided by two.

4. The circuit method of claim 1, wherein:

the voltage divider includes first, second, and third resistors in series with the first resistor coupled to the voltage source, the third resistor coupled to ground, and the second resistor coupled between the first and the third resistors;

first and second source-drain regions of the first transistor are coupled, respectively, to the voltage source and the first source-drain region of the second transistor;

a second source-drain regions of the second transistor is coupled to ground; and the bias branch further includes:

a second op-amp having a first input coupled to the first source-drain region of the first transistor, a second input coupled to the voltage divider between the first resistor and the second resistor and configured to receive a second divided voltage of the voltage source, and an output configured to drive the gate of the first transistor to pull a second node to the second divided voltage.

5. The circuit method of claim 1, wherein the bias branch further includes a coupling capacitor disposed between a first source-drain region and the gate of the first transistor.

6. The circuit method of claim 5, wherein:

a first resistor is coupled between the gate of the first transistor and the gate of the third transistor; and a second resistor is coupled between the gate of the second transistor and the gate of the fourth transistor.

7. The circuit method of claim 6, wherein:

first and second capacitors are coupled to opposite ends of the first resistor; and third and fourth capacitors are coupled to opposite ends of the second resistor.

8. The circuit method of claim 7, wherein the first, second, third, and fourth capacitors are configured to decouple an input node of the current mirror from an output node of the current mirror.

9. The circuit method of claim 1, wherein:
a first inductor is coupled between the third transistor and the voltage source;
a second inductor is coupled between the fourth transistor and the ground;
a node between the third and fourth transistors is an input node configured to receive an AC signal;
a node between the first inductor and the third transistor is a first output node; and
a node between the second inductor and the fourth transistor is a second output node.

10. The circuit method of claim 1, wherein the bias branch further includes a controlled-current source coupled between the voltage source and a first source-drain region of the first transistor, and the power amplifier core is configured to mirror a current from the controlled-current source provided to the bias branch.

11. The circuit method of claim 10, wherein:
a first inductor is coupled between the third transistor and the voltage source;
a fifth transistor is coupled between the controlled-current source and the first source-drain region of the first transistor;
a sixth transistor is coupled between the ground and a first source-drain region of the second transistor;
a seventh transistor is coupled between the first inductor and a first source-drain region of the third transistor;
an eighth transistor is coupled between the ground and a first source-drain region of the fourth transistor;
gates of the fifth and seventh transistors are coupled to a first bias-voltage source; and
gates of the sixth and eighth transistors are coupled to each other and to a second bias-voltage source.

12. The circuit method of claim 11, wherein the fifth, sixth, seventh, and eighth transistors are configured to decouple an input of the current mirror from outputs of the current mirror.

13. The circuit method of claim 11, wherein:
a first resistor is coupled between the gate of the first transistor and the gate of the seventh transistor; and
a second resistor coupled between the gate of the second transistor and the gate of the fourth transistor.

14. The circuit method of claim 13, wherein;
first and second capacitors are coupled to opposite ends of the first resistor; and
third and fourth capacitors are coupled to opposite ends of the second resistor.

15. A current mirror comprising:
a bias branch including:
first and second transistors configured in series between a voltage source and a ground;
a voltage divider coupled between the voltage source and the ground; and
an op-amp configured to receive as input a divided voltage of the voltage divider and a voltage of a node between the first and second transistors, and drive a gate of the second transistor to pull the node to the divided voltage;
a power amplifier core coupled to the bias branch including third and fourth transistors configured in series between the voltage source and the ground, wherein:
the first and third transistors are complementary to the second and fourth transistors;
a gate of the first transistor and a gate of the third transistor are coupled, and
the gate of the second transistor and a gate of the fourth transistor are coupled.

16. A current mirror comprising:
a bias branch including:
first and second transistors configured in series between a voltage source and a ground; and
a voltage divider coupled between the voltage source and the ground; and
an op-amp configured to receive as input a divided voltage of the voltage divider and a voltage of a node between the first and second transistors, and drive a gate of the second transistor to pull the node to the divided voltage;
a power amplifier core coupled to the bias branch including:
third and fourth transistors configured in series between the voltage source and the ground, wherein:
a gate of the first transistor and a gate of the third transistor are coupled, and
the gate of the second transistor and a gate of the fourth transistor are coupled; and
a first inductor that is coupled between the third transistor and the voltage source.

17. The current mirror of claim 16, further comprising a second inductor coupled between the fourth transistor and the ground, wherein:
a node between the third and fourth transistors is an input node configured to receive an AC signal,
a node between the first inductor and the third transistor is a first output node, and a node between the second inductor and the fourth transistor is a second output node.

18. The current mirror of claim 16, wherein:
the bias branch further includes:
a fifth transistor coupled between the controlled-current source and the first source-drain region of the first transistor, and
a sixth transistor coupled between the ground and a first source-drain region of the second transistor; and
the power amplifier core further includes:
a seventh transistor coupled between the first inductor and a first source-drain region of the third transistor, and
an eighth transistor coupled between the ground and a first source-drain region of the fourth transistor, and wherein
gates of the fifth and seventh transistors are coupled to a first bias-voltage source, and
gates of the sixth and eighth transistors are coupled to each other and to a second bias-voltage source.

* * * * *

UNITED STATES PATENT AND TRADEMARK OFFICE
CERTIFICATE OF CORRECTION

PATENT NO. : 8,878,612 B2
APPLICATION NO. : 13/944608
DATED : November 4, 2014
INVENTOR(S) : Leong et al.

It is certified that error appears in the above-identified patent and that said Letters Patent is hereby corrected as shown below:

In the Specification

At Column 2, Line 29, change "the first and second" to --the first and third--.

At Column 2, Line 30, change "the third and fourth" to --the second and fourth--.

At Column 3, Line 38, change "second transistor and the gate of the fourth transistor" to --sixth transistor and the gate of the eighth transistor--.

In the Claims

At Column 9, Claim 13, Line 38, change "gate of the first" to --gate of the fifth--.

At Column 9, Claim 13, Line 40, change "gate of the second" to --gate of the sixth--.

At Column 9, Claim 13, Line 41, change "gate of the fourth" to --gate of the eighth--.

Signed and Sealed this
Eighteenth Day of April, 2017

Michelle K. Lee
*Director of the United States Patent and Trademark Office*